United States Patent
Chu

(10) Patent No.: US 9,494,855 B2
(45) Date of Patent: Nov. 15, 2016

(54) LITHOGRAPHY-ORIENTED PHOTOMASK REPAIR

(71) Applicant: Taiwan Semiconductor Manufacturing Co., Ltd., Hsin-Chu (TW)

(72) Inventor: Yuan-Chih Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 188 days.

(21) Appl. No.: 14/205,748

(22) Filed: Mar. 12, 2014

(65) Prior Publication Data
US 2015/0261085 A1    Sep. 17, 2015

(51) Int. Cl.
*G03F 1/26* (2012.01)
*G03F 1/50* (2012.01)
*G03F 1/72* (2012.01)

(52) U.S. Cl.
CPC ........................................ *G03F 1/72* (2013.01)

(58) Field of Classification Search
CPC .................................... G03F 1/26; G03F 1/50
See application file for complete search history.

(56) References Cited

U.S. PATENT DOCUMENTS 5,536,604 A * 7/1996 Ito ............................. G03F 1/32
                                                                          430/321
6,306,547 B1 * 10/2001 Kobayashi .............. G03F 1/144
                                                                          430/5

* cited by examiner

*Primary Examiner* — Stephen Rosasco
(74) *Attorney, Agent, or Firm* — Eschweiler & Associates, LLC

(57) ABSTRACT

Some embodiments of the present disclosure relate to a method for repairing a photomask pattern, comprising receiving a photomask with a first translucent material formed on a transparent substrate, which forms an incomplete version of the photomask pattern. Missing portions of the photomask pattern are detected by comparing the incomplete version of the photomask pattern to a complete version of the photomask pattern. After detecting the missing portions, the photomask pattern is completed by using a second translucent material, which is different than the first translucent material, to form the missing portions. The second translucent exhibits the same transmissive property as the first translucent material. Consequently, both the repaired and unrepaired portions of the pattern have the same transmissive properties with respect to attenuation and phase shifting of incident radiation to enhance pattern resolution in the repaired portion of the photomask pattern.

21 Claims, 10 Drawing Sheets

LITHOGRAPHY-ORIENTED PHOTOMASK REPAIR

BACKGROUND

The following disclosure relates to semiconductor manufacturing methods. In particular, the following disclosure relates to a method to repair a transparent photomask.

Integrated circuits (ICs) are manufactured by transferring geometric patterns from photomasks to light-sensitive material known as "photoresist". In particular, a geometric pattern is formed on a layer of photoresist on a semiconductor substrate by providing light through a photomask. The photomask includes a transparent substrate (e.g., quartz) that is partially covered with an opaque material (e.g., chrome). The portions of the transparent material covered with opaque material blocks light, while the remaining uncovered portions of the transparent substrate allow light to pass therethrough, such that the light passing through the photomask transfers a pattern to the photoresist. After the photoresist has been exposed in this fashion, the photoresist is developed to selectively remove portions of the photoresist which were exposed to (or not exposed to) light, depending on whether the photoresist has a negative or positive tone. In some instances, the underlying substrate can then be etched with the patterned photoresist in place and the photoresist layer can be subsequently removed. Multiple patterned layers can be built up on the IC in this fashion to fabricate overall IC design.

In some instances, however, a portion of the pattern of opaque material does not form on the photomask due to errors with the photomask manufacturing process. As a result, if the incomplete pattern is transferred to the photoresist on the wafer, the resultant IC will be patterned incorrectly, and will likely fail to meet design specifications. Several methods of photomask repair may be used to replace the missing portion of the pattern and thereby ward off such IC failures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F illustrate a series of views that collectively depict some embodiments of repairing a photomask pattern formed by a first translucent material with a second translucent material.

DETAILED DESCRIPTION

Figures 1A, 1B:
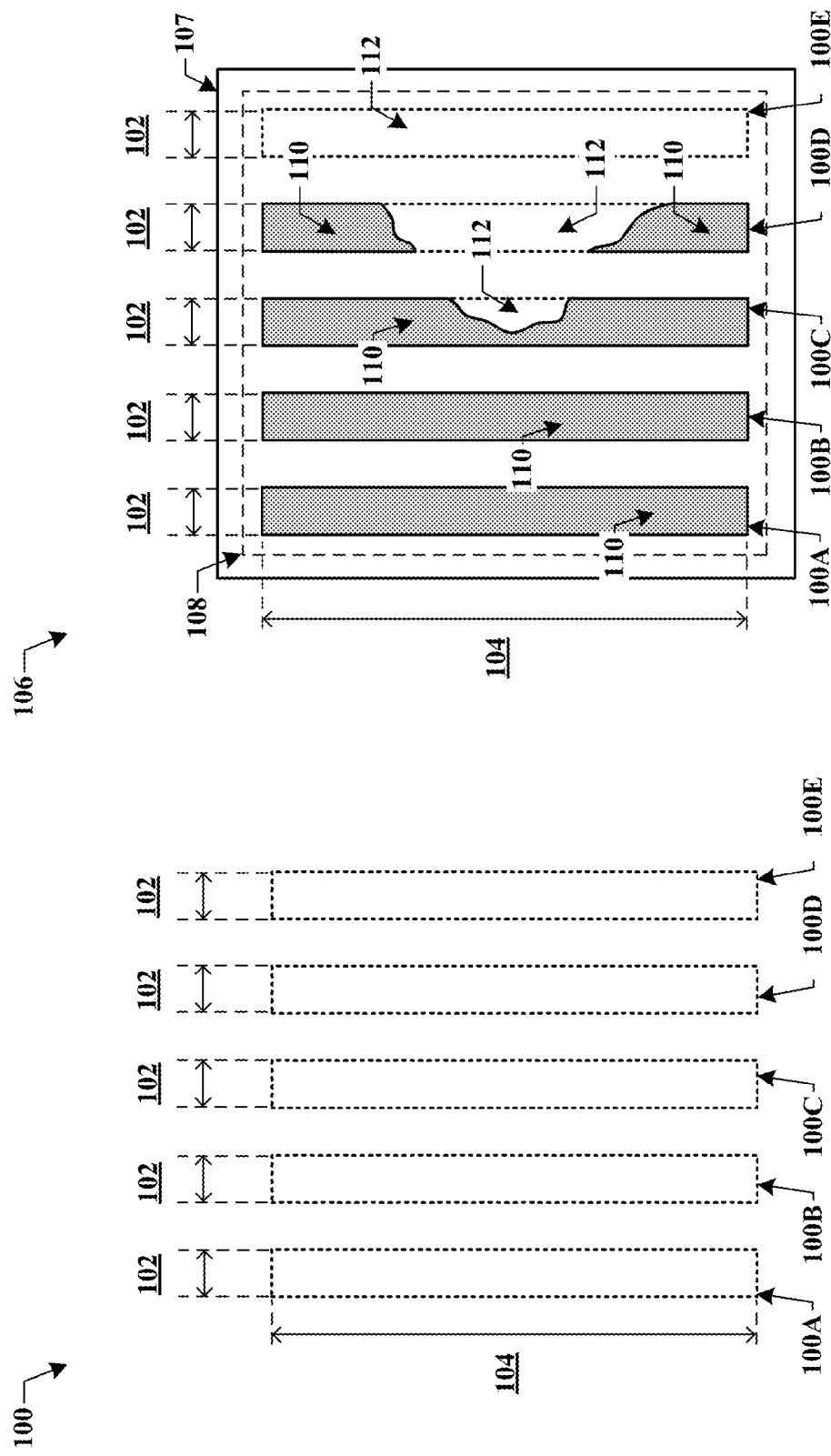
FIGS. 1A-1E illustrate views of some embodiments of repairing a photomask pattern.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over," "on," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photomasks are used in optical lithography for patterning of a semiconducting wafer. A binary photomask consists of a pattern of opaque material (e.g., chrome) formed on a transparent substrate (e.g., quartz). While binary photomasks are widely used in semiconducting manufacturing, they have limited resolution in advanced technology nodes. Technology node scaling has driven advanced technology node feature sizes below the resolution limit for optical lithography (i.e., the Rayleigh Criterion). A pattern formed by a binary photomask under such conditions becomes "fuzzy" because of interference effects between light that passes through the transparent portions of the pattern. To improve resolution, an attenuating phase shift photomask (APSM) can be used in place of a binary mask.

An APSM improves image resolution over a binary photomask by using a pattern of translucent material in place of a purely opaque material. The translucent material has a transmissive property that allows a portion of the light to pass through it (e.g., around 5%-20%). The light transmitted by the translucent material is not intense enough to react with photoresist, but it does interfere with light transmitted by the transparent substrate to improve pattern resolution. The transmissive property also causes the translucent material to transmit light that is 180° out of phase with light transmitted by the transparent substrate. Due to the phase difference, the intensity of the light is zero near a boundary between the translucent material and transparent substrate (i.e., at the boundary of the pattern), having the effect of "sharpening" the pattern through "destructive interference" of the light near the boundary.

In some instances, a portion of the material is missing from the pattern due to errors in the photomask manufacturing process. A binary photomask can be repaired with the same opaque material from which the incomplete pattern was formed. In contrast, an APSM photomask cannot repair the pattern with the same material from which it is formed. As a result, the repaired portions of the pattern must use a different material with different a transmissive property than the translucent material. In particular, the different material may not attenuate and phase shift incident light by the same amount as the translucent material. As a result, the repaired portions of the pattern formed on an APSM do not exhibit the same enhanced pattern resolution as the unrepaired portions.

Some embodiments of the present disclosure relate to a method for repairing a pattern formed on an APSM. The method comprises receiving a photomask comprising a first translucent material formed on a transparent substrate. The first translucent material forms an incomplete version of a photomask pattern, which is missing a portion of the pattern. The method further comprises detecting the missing a portion of the photomask pattern by comparing the incomplete version of the photomask pattern to a complete version of the photomask pattern. After detecting the missing portion, completing the photomask pattern by using a second translucent material, which is different than the first translucent material, to form the missing portion of the photomask pattern. In various embodiments, the second translucent material exhibits the same transmissive property as the first translucent material, and may formed from a single material, or by combining two or more translucent materials, which have different transmissive properties than the first translucent material, but are combined in such a manner that the combination exhibits the same transmissive property as the first translucent material. Consequently, both the repaired and unrepaired portions of the pattern have the same transmissive properties with respect to attenuation and phase shifting of incident radiation to enhance pattern resolution in the repaired portion of the pattern.

FIGS. 1A-1E illustrate views of some embodiments of repairing a photomask pattern. FIG. 1A illustrates a top-down view of some embodiments of a target pattern 100 to be formed on a photomask. The target pattern is typically defined in an EDA flow, and is represented as GDSII, OASIS, or other form of graphical shape data. For the embodiments of FIGS. 1A-1E, the target pattern 100 comprises first through fifth linear segments 100A-100E of equal width 102 and length 104. In various embodiments, the target pattern 100 corresponds to components of an integrated circuit (IC) (e.g., devices, wires, contacts, etc.) formed on a semiconducting wafer.

FIG. 1B illustrates a top-down view of a transparent photomask 106, whereupon an incomplete version 108 of the target pattern 100 is formed on a transparent substrate 107 (e.g., quartz). The incomplete version 108 of the target pattern 100 includes a first translucent material 110 (e.g., molybdenum silicide (MoSi)). The incomplete version 108 of the target pattern 100 is caused by errors with the photomask patterning process, wherein an attempt is made to form the complete target pattern 100, and results in missing portions 112 of the target pattern 100. The missing portions 112 are detected during inspection of the transparent photomask 106.

Figures 1C, 1D, 1E:
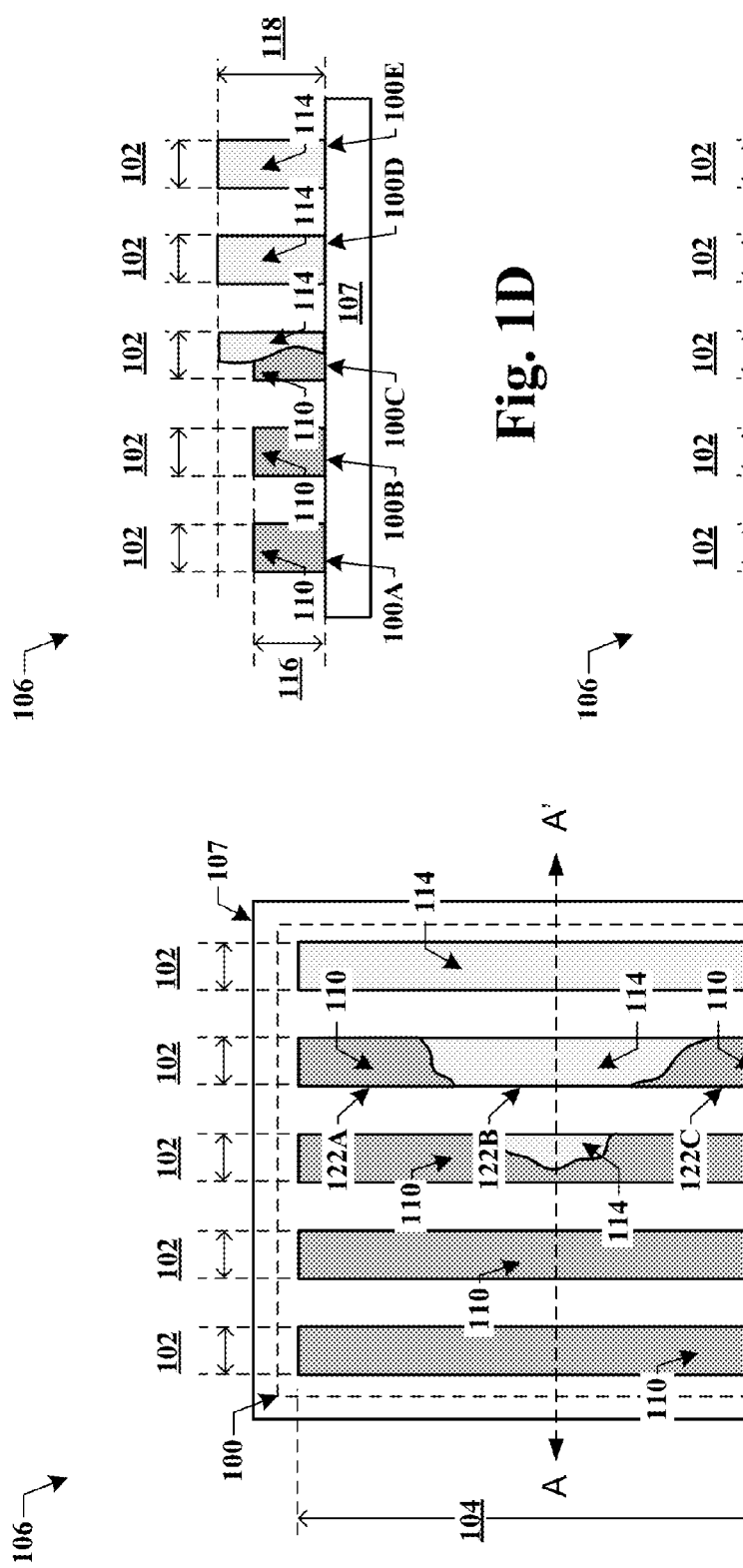

FIG. 1C illustrates a top-down view of a transparent photomask 106, where after detection, the missing portions 112 are formed by supplementing the incomplete version 108 of the target pattern 100 with a second translucent material 114, which has a different chemical composition than the first translucent material 110, to fully-form the target pattern 100. In some embodiments, comprising formation of an attenuating phase shift photomask (APSM), the first translucent material 110 is configured to transmit a small amount of radiation that is 180° out of phase with radiation transmitted through the transparent substrate 107. For these embodiments, the second translucent material 114 is also configured to transmit radiation that is 180° out of phase with radiation transmitted through the transparent substrate 107, and in phase with radiation transmitted by the first translucent material 110. Therefore, the entire target pattern 100 is formed from the first and second translucent materials 110, 114, which have the same transmissive properties with respect to attenuation and phase shifting of incident radiation.

FIG. 1D illustrates a cross-sectional view of some embodiments of the transparent photomask 106 along cross-section AA' of FIG. 1C. One or more of the transmissive properties of the second translucent material 114 are adjusted to match those of the first translucent material 110 by varying a second thickness 118 of the second translucent material 114 relative to a first thickness 116 of the first translucent material 110. For instance, in some embodiments the first translucent material 110 comprises MoSi, and the missing portions 112 of the target pattern 100 are replaced with a second translucent material 114 comprising tetraethyl orthosilicate (($Si(OC_2H_5)_4$) or "TEOS"). TEOS has similar transmissive properties as MoSi with respect to attenuation and phase shifting of incident radiation. To adjust the amount by which incident radiation is phase shifted, the second thickness 118 of the TEOS (114) can be adjusted so that the incident radiation that it transmits is 180° out of phase with radiation transmitted through the transparent substrate 107, and in phase with radiation transmitted by the MoSi (110).

While the first and second thicknesses 116, 118 of the first and second translucent materials 110, 114 of FIG. 1D differ, the width 102 of each of the first through fifth linear segments 100A-100E remain constant throughout their lengths 104. In particular, as illustrated in FIG. 1C, linear segment 100D includes a first linear segment 122A of first translucent material 110 that adjoins a second linear segment 122B of second translucent material 114. The linear segment 100D includes a third linear segment 122C of first translucent material 110 that adjoins the second linear segment 122B of second translucent material 114. The first, second, and third linear segments 122A-122C are co-linear and have equal widths 102.

FIG. 1E illustrates a cross-sectional view of some embodiments of the transparent photomask 106 along cross-section AA' of FIG. 1C. One or more of the transmissive properties of the second translucent material 114 are adjusted to match those of the first translucent material 110 by varying a composition of the second translucent material 114, while keeping the thicknesses 120 and width 102 of the first and second translucent materials 110, 114 equal. The composition of the second translucent material 114 can be varied by mixing molecules of third and fourth translucent materials with a ratio such that the mixture results in a second translucent material 114 that exhibits one or more same transmissive properties (e.g., refractive index, amount of phase shift of transmitted radiation, etc.) as the first translucent material 110. Determination of the structure and composition of the second translucent material 114 will be discussed in greater detail in the embodiments of FIGS. 2A-2F, and 3A-3D.

Therefore, the embodiments of FIGS. 1A-1E have an advantage over some prior art approaches that the missing portions 112 of the target pattern 100 formed from the first translucent material 110 can by replaced by one or more translucent materials. The one or more translucent materials are different than the first translucent material 110, but (in combination) exhibit the same transmissive properties with respect to attenuation and phase shifting of incident radiation as the first translucent material 110. The embodiments of the present disclosure change the composition of the repaired portions of the target pattern 100 so that the repaired and unrepaired portions of the target pattern 100 have the same transmissive properties while maintaining the width of the repaired portions of the target pattern 100. As a result, the target pattern 100 can be more readily scaled in advanced technology nodes.

Figure 2C:
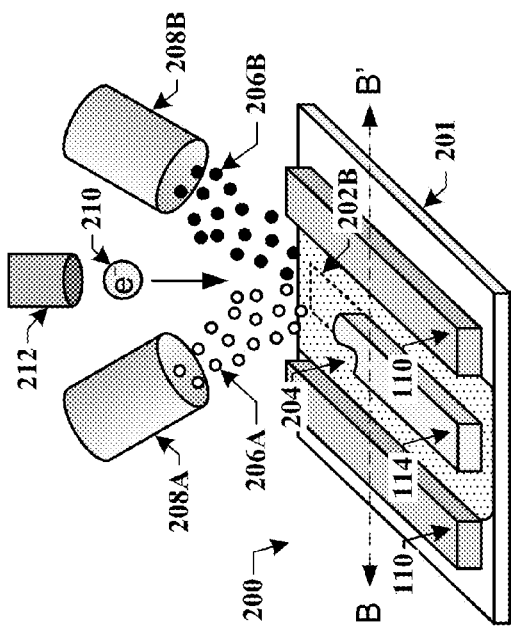
Figure 2A:
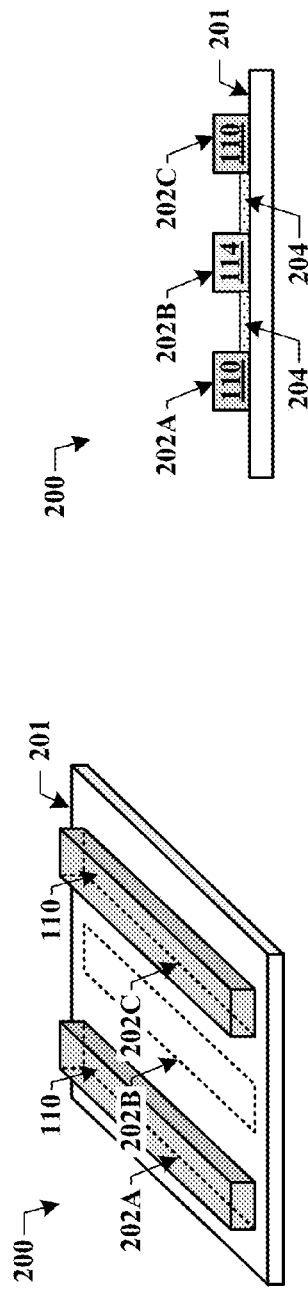
Figure 2A:
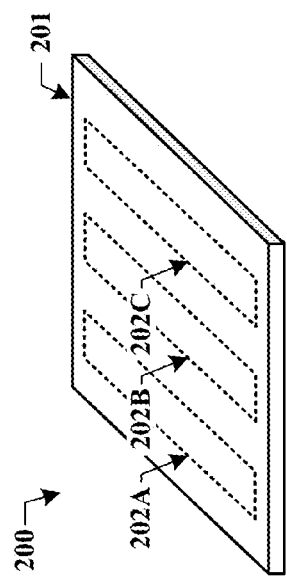

FIGS. 2A-2F illustrate a series of views that collectively depict some embodiments of repairing a photomask pattern formed by a first translucent material with a second translucent material. FIG. 2A illustrates a three-dimensional (3D) view of a transparent photomask 200, whereupon a target pattern is defined on a transparent substrate 201. The target pattern consists of first through third linear segments 202A-202C. While the target pattern of FIG. 2A is illustrated as linear segments, other embodiments comprise other geometries (e.g., "L-shapes," "H-shapes," etc.). The target pattern shapes may also be subject to mask-preparation techniques such an optical proximity correction (OPC) through a biasing of edges of the shape (e.g., sizing the shape "up" or "down"), the addition of assist features (e.g., sub-resolution assist features (SRAFs)). The target pattern shapes may also be subject other shape-manipulation techniques intended to maintain target pattern shape geometries when the target pattern is transferred to a wafer through optical lithography.

Figure 2B:
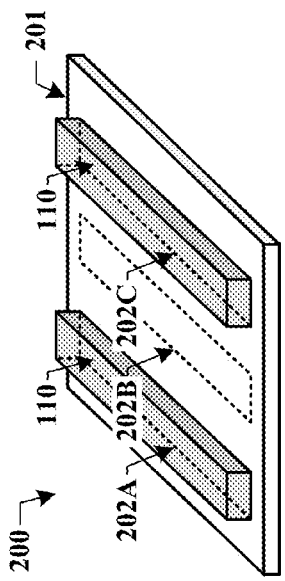

FIG. 2B illustrates a 3D view of the transparent photomask 200, where an attempt to form the target pattern has been made. In some embodiments, the attempt to form the pattern is made through a photoresist patterning process, wherein a layer of first translucent material 110 (e.g., molybdenum silicide (MoSi)) is formed over the transparent substrate 201, and a layer of photoresist is formed over the layer of first translucent material 110. The layer of photoresist is exposed to radiation (e.g., visible, ultra-violet, etc.), which reacts with the photoresist to form the target pattern. The target pattern is then etched through the layer of photoresist and into the layer of first translucent material 110. Excess first translucent material 110 is removed from the surface of the transparent substrate 201 after the etch.

For the embodiments of FIGS. 2A-2F, the first and third linear segments 202A, 202C are formed by the first translucent material 110, while the second linear segment 202B is not formed. This may result from "lift-off" of the first translucent material 110 while forming the second linear segment 202B during or after patterning. The missing second linear segment 202B may also result from a missing portion of the layer of first translucent material 110 prior to patterning, or may result from other errors with the photomask manufacturing process. Whatever the cause, the resulting target pattern is incomplete due to the missing second linear segment 202B.

Though shown prominently in FIG. 2B, in some embodiments, the missing a portion of the pattern (202B) may comprise a single shape out of thousands or millions of shapes of a target pattern, or small portion of the single shape, etc., who's absence would not be noticed without a deliberate check. For this reason, in some embodiments, the patterned photomask may be subjected to a photomask inspection step, which utilizes one or more commercially-available systems that utilize optical techniques (e.g., scanning electron microscopy (SEM), interferometry, etc.), to detect the portion of the pattern.

After detecting the missing portion of the target pattern (i.e., missing second linear segment 202B), the incomplete version of the target pattern is supplemented by forming the second linear segment 202B from a second translucent material 114, which is different that the first translucent material, as illustrated in FIG. 2C.

FIG. 2C illustrates a 3D view of some embodiments of forming the missing portion (202B) of the target pattern, thereby producing the entire target pattern on the transparent substrate 201. In FIG. 2C, the transparent photomask 200 has been placed in-situ, and the missing portion (202B) of the target pattern is formed by focused electron beam induced deposition (FEBID). In FEBID, the surface of the transparent substrate 201 is exposed to one or more precursor gases, which are absorbed by the surface. The absorbed precursor gas(es) are then exposed to a focused electron beam (e-beam), which dissociates the precursor gas(es) into their constituent components, which combine into the second translucent material 114 to form the missing portion (202B) of the pattern.

For the embodiments of FIG. 2C, the missing portion (202B) of the target pattern is supplemented through FEBID, where the surface of the transparent substrate 201 is exposed to first and second precursor gases 206A, 206B provided by first and second capillaries 208A, 208B. The first and second capillaries 208A, 208B are coupled to a gas supply system that is configured to independently control the flux of each precursor gas (206A, 206B) through its respective capillary (208A, 208B) to control the composition of the second translucent material 114 formed from the first and second precursor gases 206A, 206B. In some embodiments, the gas supply system comprises an independent precursor reservoir coupled to each of the first and second capillaries 208A, 208B.

The open end of the first and second capillaries 208A, 208B are brought into close proximity to the surface of the transparent substrate 201 so that the first and second precursor gases 206A, 206B, which are constantly replenished by a gas-supply system, can absorb together into the surface. The absorbed first and second precursor gases 206A, 206B are exposed to a focused e-beam 210, which causes them to disassociate and form the missing portion of the target pattern by combining to form the second translucent material 114.

In some embodiments, the focused e-beam 210 is provided by a scanning or transmission electron microscope (SEM or TEM) 212, or other electron source. Material on the surface of the transparent substrate 201 in an area 204 of the absorbed first and second precursor gases 206A, 206B, where the e-beam 210 is focused, is irradiated by electrons. The material in the area 204 re-emits secondary electrons (e.g., around 1 keV) that decompose the first and second precursor gases 206A, 206B, which combine into the second translucent material 114 to form the missing portion of the target pattern (i.e., missing second linear segment 202B). In some embodiments, the material dissociated from the first and second precursor gases 206A, 206B combines at the molecular level to form a compound, wherein the materials mix such that the compound appears nearly homogenous. In some embodiments, the material dissociated from the first and second precursor gases 206A, 206B combines into a layered heterostructure, as will be illustrated in greater detail in the embodiments of FIGS. 3A-3D.

In some embodiments, first precursor gas 206A contains a translucent material with one or more transmissive properties that are similar to the first translucent material 110. In some embodiments, second precursor gas 206B contains a material that is durable and resistant to photons. In various embodiments, the one or more transmissive properties may comprise the refractive index, or the amount by which radiation transmitted by the material is phase-shifted. For instance, TEOS can adjust the phase of transmitted radiation, and can be made to transmit radiation that is 180° out of phase with radiation transmitted through the transparent substrate 201, while transmitting radiation that is in phase with the first translucent material 110. In some embodiments, this is accomplished by varying the thickness of the second translucent material 114 formed by the first and second precursor gases 206A, 206B relative to the thickness of the first translucent material 110.

In some embodiments, the FEBID process forms the second translucent material 114 by absorbing and dissociating the first and second precursor gases 206A, 206B simultaneously, to form a substantially homogenous compound of second translucent material 114. Moreover, by combining dissociated precursor materials with a composition that is "tuned" so that the second translucent material 114 exhibits the same transmissive properties as the first translucent material 110, the FEBID repair process maintains "on-edge" alignment between co-linear segments of the first and second translucent materials 110, 114 (i.e., equal width and thickness of adjoining co-linear segments).

In some embodiments, first precursor gas 206A comprises chromium carbonyl ($Cr(CO)_6$) and the second precursor gas comprises tetraethyl orthosilicate (($Si(OC_2H_5)_4$ or TEOS). The focused electron beam dissociates the chromium carbonyl into chromium (Cr) and carbon monoxide (CO), and dissociates the TEOS into silicon dioxide ($SiO_2$) and various concentrations of silicon oxycarbide (SiOC):

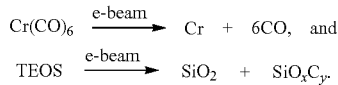

A mixing process with TEOS and Chromium carbonyl can achieve on-edge deposition.

FIG. 2D illustrates a cross-sectional view of the transparent photomask 200, along cross-section BB' of FIG. 2C, which shows the fully-formed target pattern, after evacuation of the first and second precursor gases 206A, 206B. The fully-formed target pattern comprises first and third linear segments 202A, 202C comprising the first translucent material 110, while the second linear segment 202B comprises the second translucent material 114. In addition, some residue from the absorbed first and second precursor gases 206A, 206B remains in the area 204.

Figure 2E:
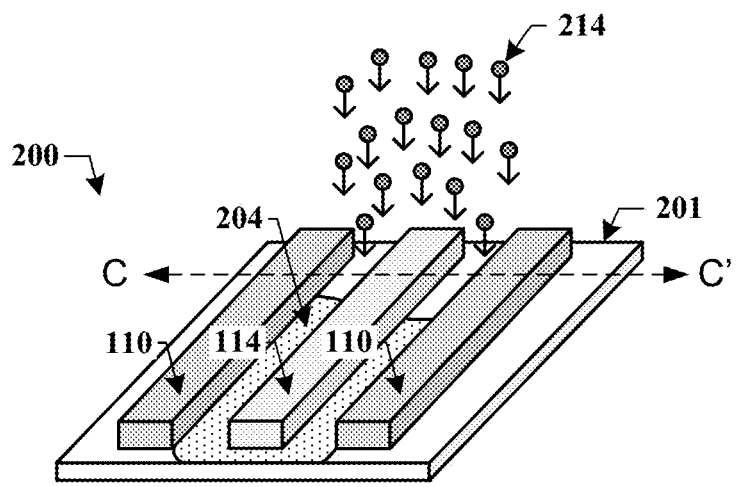
Figure 2F:
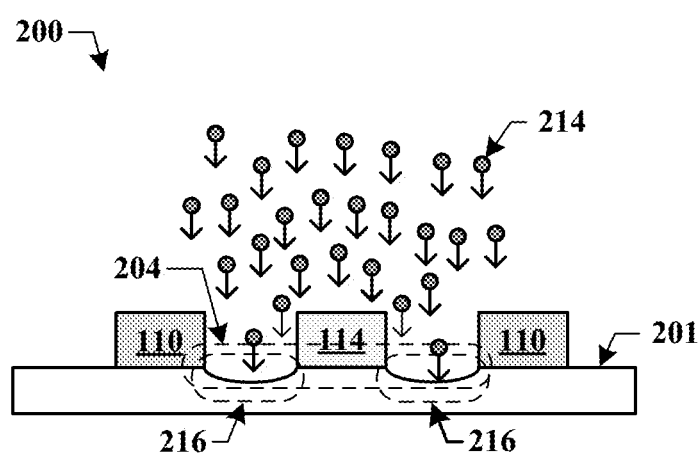

FIG. 2E illustrates a 3D view of some embodiments of removing the residue from the absorbed first and second precursor gases 206A, 206B from the area 204. For the embodiments of FIG. 2E, the residue is removed by a dry plasma etch comprising bombarding the surface of the transparent substrate 201 with ionized particles 214. The ionized particles 214 remove the residue from the area 204, and also recess (216) the surface within the area 204, as illustrated in the cross-sectional view of the transparent photomask 200 along cross-section CC' in FIG. 2F.

Figure 3C:
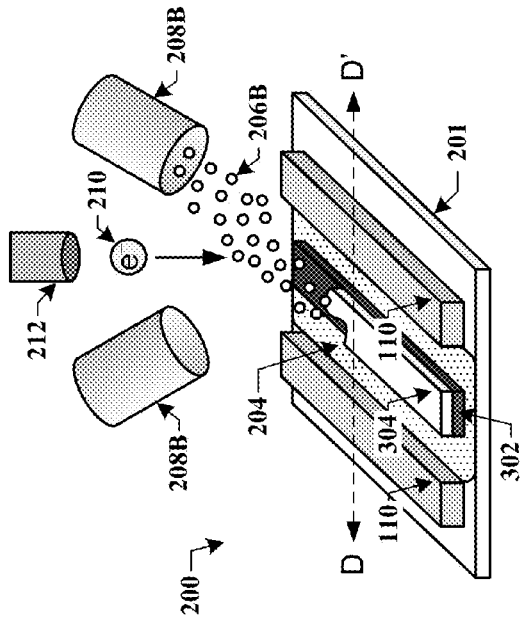
FIGS. 3A-3D illustrate a series of views that collectively depict some embodiments of repairing a photomask pattern by sequentially depositing translucent materials to form a heterostructure.
Figure 3D:
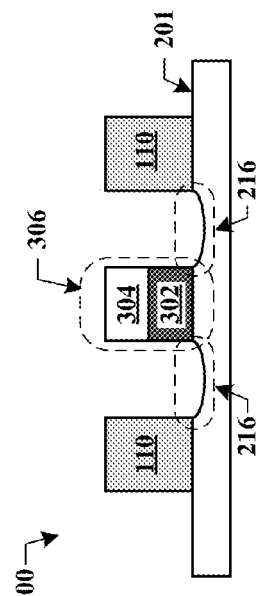
Figure 3A:
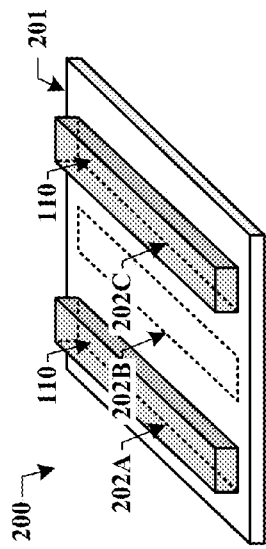

FIGS. 3A-3D illustrate a series of views that collectively depict some embodiments of repairing a photomask pattern by forming a heterostructure. FIG. 3A illustrates a 3D view of the transparent photomask 200, which is essentially the same structure as shown in FIG. 2B. A target pattern comprising first through third linear segments 202A-202C is defined. An attempt to form the target pattern is then made, but only the first and third linear segments 202A, 202C form, while the second linear segment 202B does not. To repair the missing portion (202B) of the pattern, a FEBID process is used, wherein one or more precursor gases are introduced to the surface of the transparent substrate 201 in close proximity to the focused e-beam 210. However, unlike the embodiments of FIGS. 2A-2F where the precursor gases were absorbed and dissociated simultaneously to form a substantially homogenous compound, the precursor gases of FIGS. 3A-3D are absorbed and dissociated sequentially to form a hetero structure.

Figure 3B:
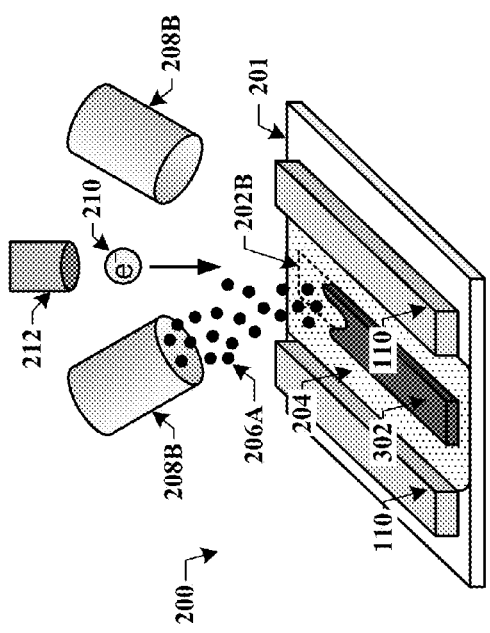

FIG. 3B illustrates a 3D view of the transparent photomask 200, where the missing portion (202B) of the target pattern is formed in-situ through a FEBID process. The surface of the transparent substrate 201 is exposed to a first precursor gas 206A (e.g., TEOS) comprising a third translucent material 302 (e.g., $SiO_2$), which is absorbed by the surface. The e-beam 210 then dissociates the third translucent material 302 from the absorbed first precursor gas 206A to form a first layer of the second linear segment 202B of the target pattern.

FIG. 3C illustrates a 3D view of the transparent photomask 200, where the first layer the second linear segment 202B of the target pattern has been fully-formed. The surface of the transparent substrate 201 is then exposed to a second precursor gas 206B (e.g., chromium carbonyl) comprising a fourth translucent material 304 (e.g., Cr), which is absorbed by the surface and the third translucent material 302 in the missing a portion (202B) of the target pattern. The second precursor gas 206B absorbed by the third translucent material 302 is then exposed to the e-beam 210, which dissociates the second precursor gas 206B into the fourth translucent material 304 above the third translucent material 302 to form a second layer the second linear segment 202B.

FIG. 3D illustrates a cross-sectional view of the transparent photomask 200 along cross-section DD' in FIG. 3C, after a dry plasma etch has been performed to remove residue from the surface of the transparent substrate 201, which also recesses (216) the surface. A heterostructure 306 comprising the first layer of the third translucent material 302 formed beneath the second layer of the fourth translucent material 304 is also shown. The relative thicknesses of the first and second layers of third and fourth translucent materials 302, 304 can be adjusted such that the heterostructure 306 comprises same transmissive properties as the first translucent material 110. In some embodiments, the heterostructure 306 comprises a thin layer of Cr (304) disposed above a layer of $SiO_2$ (302). The heterostructure 306 is also said to comprise a second translucent material.

Figure 4:
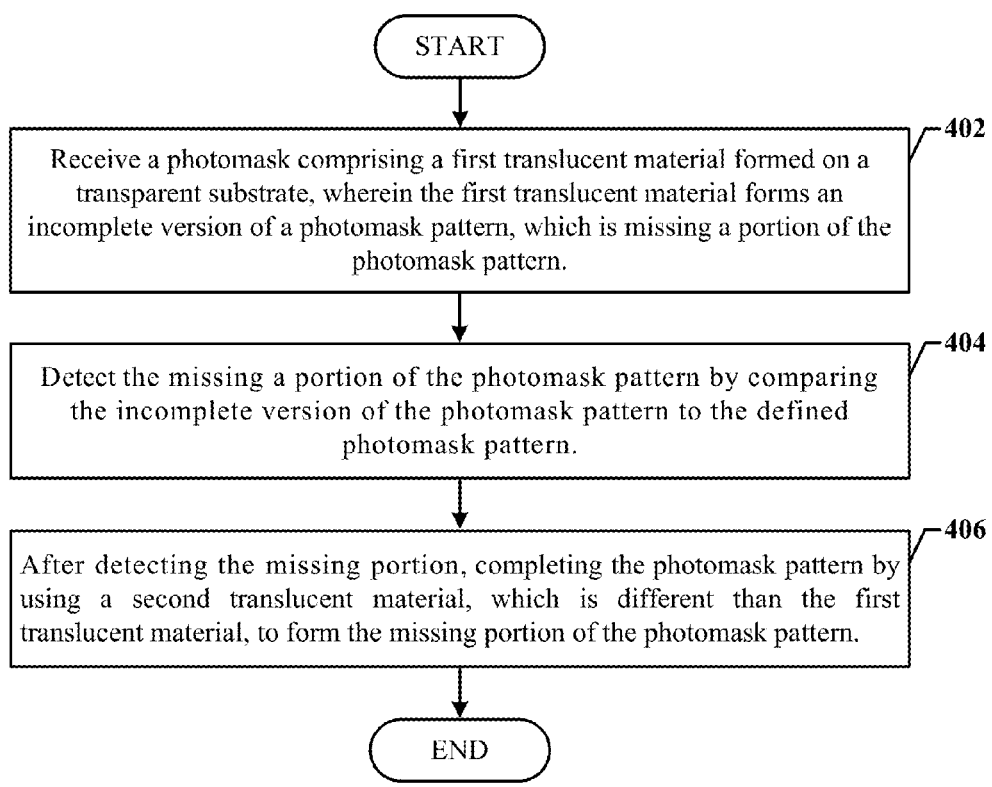
FIGS. 4-7 illustrate some embodiments of methods of repairing a photomask pattern formed by a first translucent material.

FIG. 4 illustrates some embodiments of a method 400 of repairing a photomask pattern formed by a first translucent material.

At 402 a photomask is received comprising a first translucent material formed on a transparent substrate, wherein the first translucent material forms an incomplete version of a photomask pattern, which is missing a portion of the photomask pattern. The photomask pattern may be defined within a layout design window, and subsequently manufactured by depositing the first translucent material (e.g., MoSi) on a surface of the transparent substrate (e.g., quartz). However, instead forming the photomask pattern, an incomplete version of the photomask pattern forms (e.g., missing portions of the layout shapes or entire layout shape(s)).

At 404 a photomask inspection step of the transparent photomask is performed, wherein the portion of the pattern that is missing in the incomplete version of the pattern is detected by comparing the incomplete version of the photomask pattern to the defined photomask pattern.

At 406, after detecting the missing portion, the incomplete version of the photomask pattern is completed by using a second translucent material (e.g., Cr, $SiO_2$, or a combination thereof), which is different than the first translucent material, to form the missing portion of the photomask pattern. The second translucent material is different that the first translucent material, but transmits incident radiation with one or more transmissive properties as the first translucent material. In some embodiments, the second translucent material is formed by simultaneous absorption and dissociation of two or more precursor gases through a FEBID process to form an essentially homogeneous compound that forms the missing portion of the pattern. In some embodiments, the second translucent material is formed by sequential absorption and dissociation of two or more precursor gases through a FEBID process to form a heterostructure that forms the missing portion of the pattern.

In some embodiments, wherein the transparent photomask comprises an attenuating phase shift photomask (APSM), the first translucent material is configured to transmit a small amount of radiation that is 180° out of phase with radiation transmitted through the transparent substrate. For these embodiments, the second translucent material may comprise a first transmissive property that it also transmits radiation that is 180° out of phase with radiation transmitted through the transparent substrate, and in phase with radiation transmitted by the first translucent material. In some embodiments, the second translucent material comprises a second transmissive property such that the refractive indices of the first and second translucent materials are equal.

Figure 5:
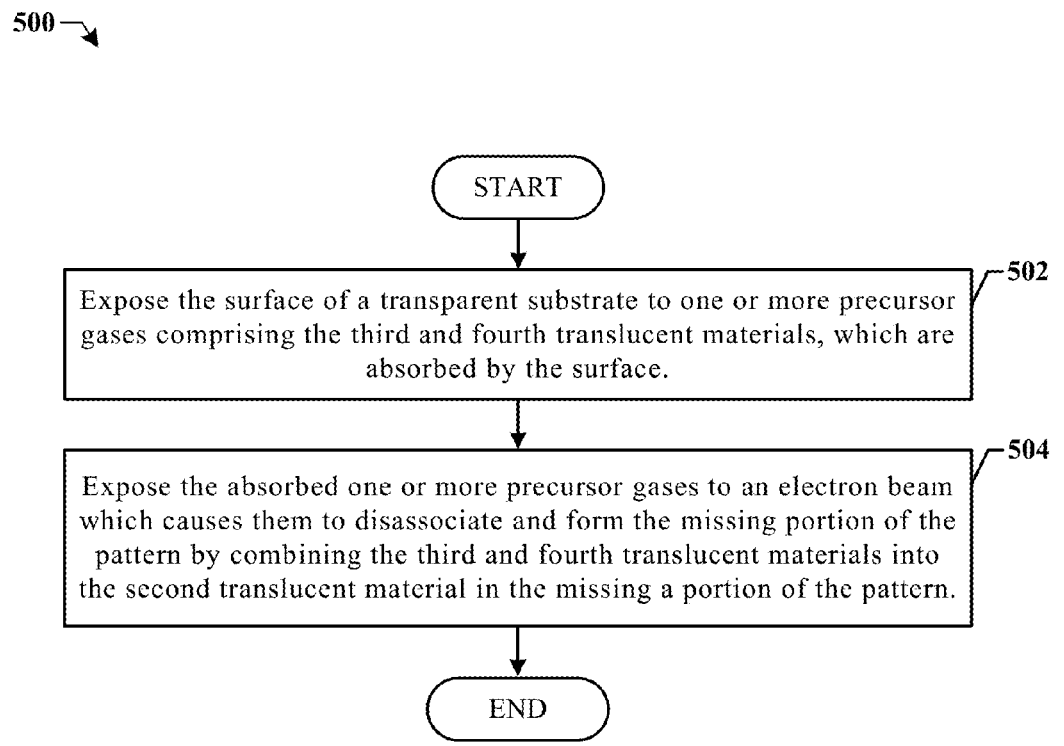

FIG. 5 illustrates some embodiments of a method 500 of repairing a photomask pattern formed by a first translucent material, by simultaneously depositing two or more precursor gases to form an essentially homogeneous compound that forms the missing portion of the pattern.

At 502 the surface of a transparent substrate is exposed to one or more precursor gases comprising the third and fourth translucent materials, which are absorbed by the surface.

At 504 the absorbed one or more precursor gases are exposed to an electron beam which causes them to disassociate and form the missing portion of the pattern by combining the third and fourth translucent materials into the second translucent material, comprising the essentially homogeneous compound, which forms in the missing a portion of the pattern.

Figure 6:
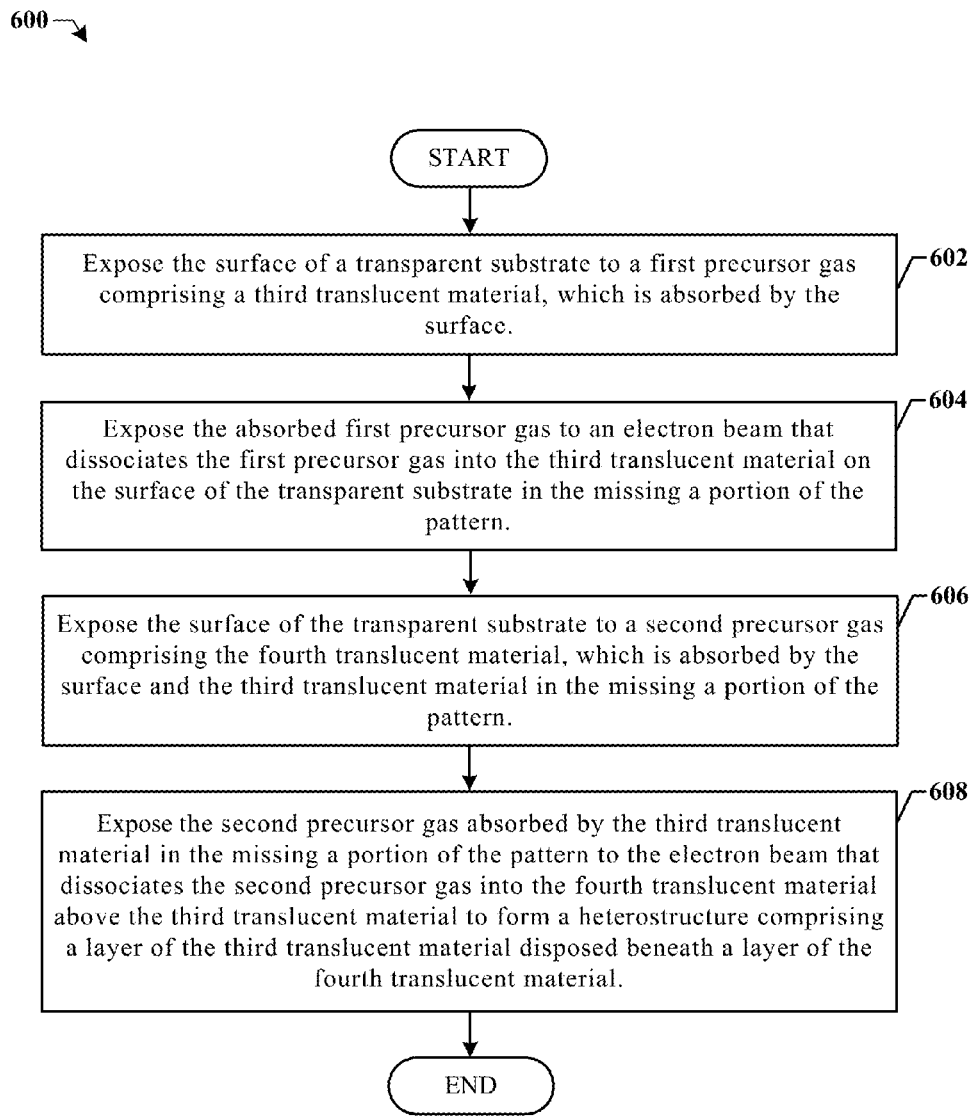

FIG. 6 illustrates some embodiments of a method 600 of repairing a photomask pattern formed by a first translucent material, by sequentially depositing two or more precursor gases form a heterostructure that forms the missing portion of the pattern.

At 602 the surface of a transparent substrate is exposed to a first precursor gas (TEOS) comprising a third translucent material (SiO$_2$), which is absorbed by the surface.

At 604 the absorbed first precursor gas is exposed to an electron beam that dissociates the first precursor gas into the third translucent material on the surface of the transparent substrate in the missing a portion of the pattern.

At 606 the surface of the transparent substrate is exposed to a second precursor gas (e.g., chromium carbonyl) comprising the fourth translucent material (e.g., Cr), which is absorbed by the surface and the third translucent material in the missing a portion of the pattern.

At 608 the second precursor gas absorbed by the third translucent material in the missing a portion of the pattern is exposed to the electron beam that dissociates the second precursor gas into the fourth translucent material above the third translucent material. This forms a heterostructure comprising a layer of the third translucent material disposed beneath a layer of the fourth translucent material.

Figure 7:
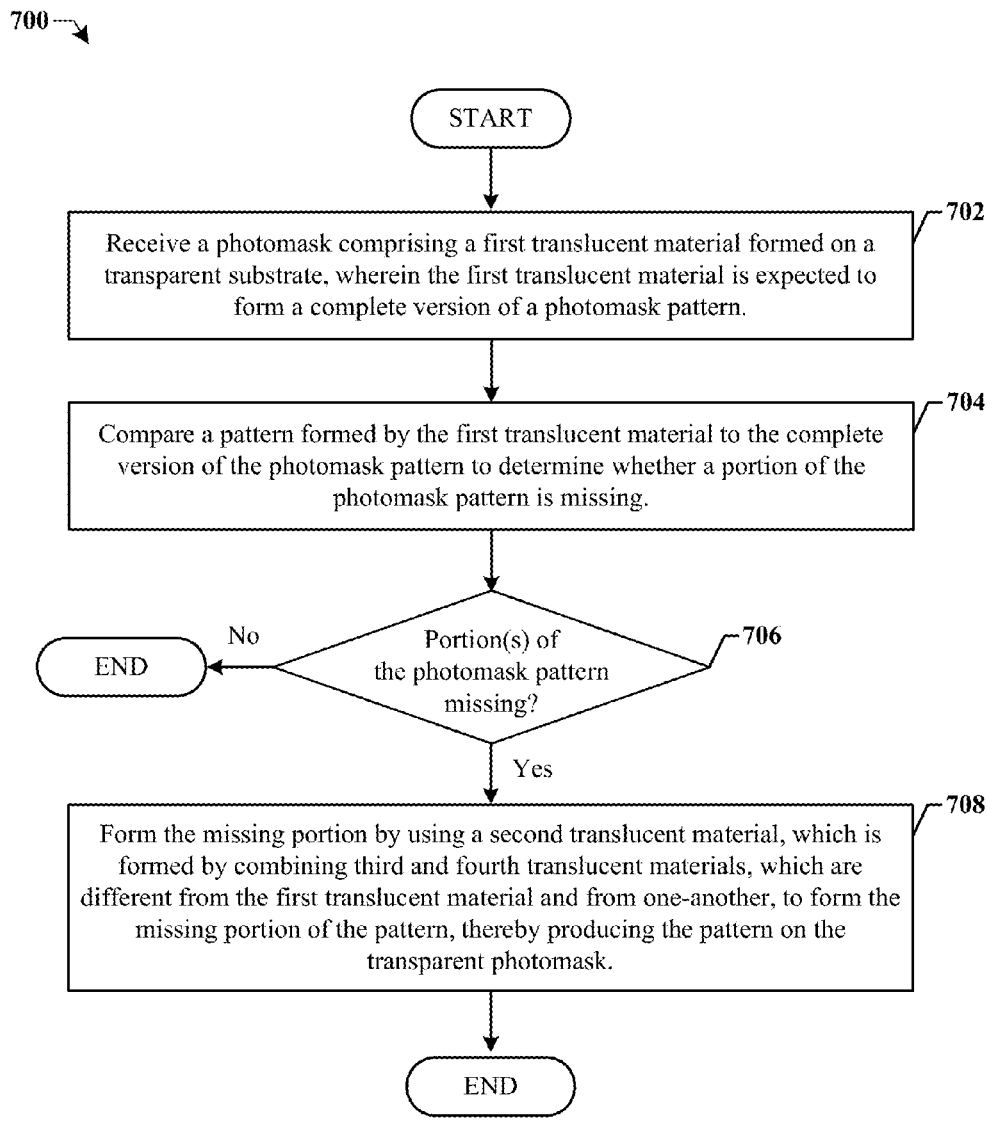

FIG. 7 illustrates some embodiments of a method 700 of inspecting a photomask pattern formed on a transparent substrate, and repairing the photomask pattern by depositing two or more precursor gases form the missing portion of the pattern.

At 702 the photomask pattern is received. The photomask pattern comprises a first translucent material formed on a transparent substrate, wherein the first translucent material is expected to form a complete version of the photomask pattern.

At 704 a pattern formed by the first translucent material is compared to the complete version of the photomask pattern to determine whether a portion of the photomask pattern is missing. In some embodiments, the comparison is done by a mask inspection tool.

At 706 a determination is made as to whether the portion of the photomask pattern is missing based upon the comparison in 704.

At 708, based upon the determination at 706, the missing portion is selectively formed by using a second translucent material, which is formed by combining third and fourth translucent materials, which are different from the first translucent material and from one-another, to form the missing portion of the pattern, thereby producing the pattern on the transparent photomask.

Figure 8:
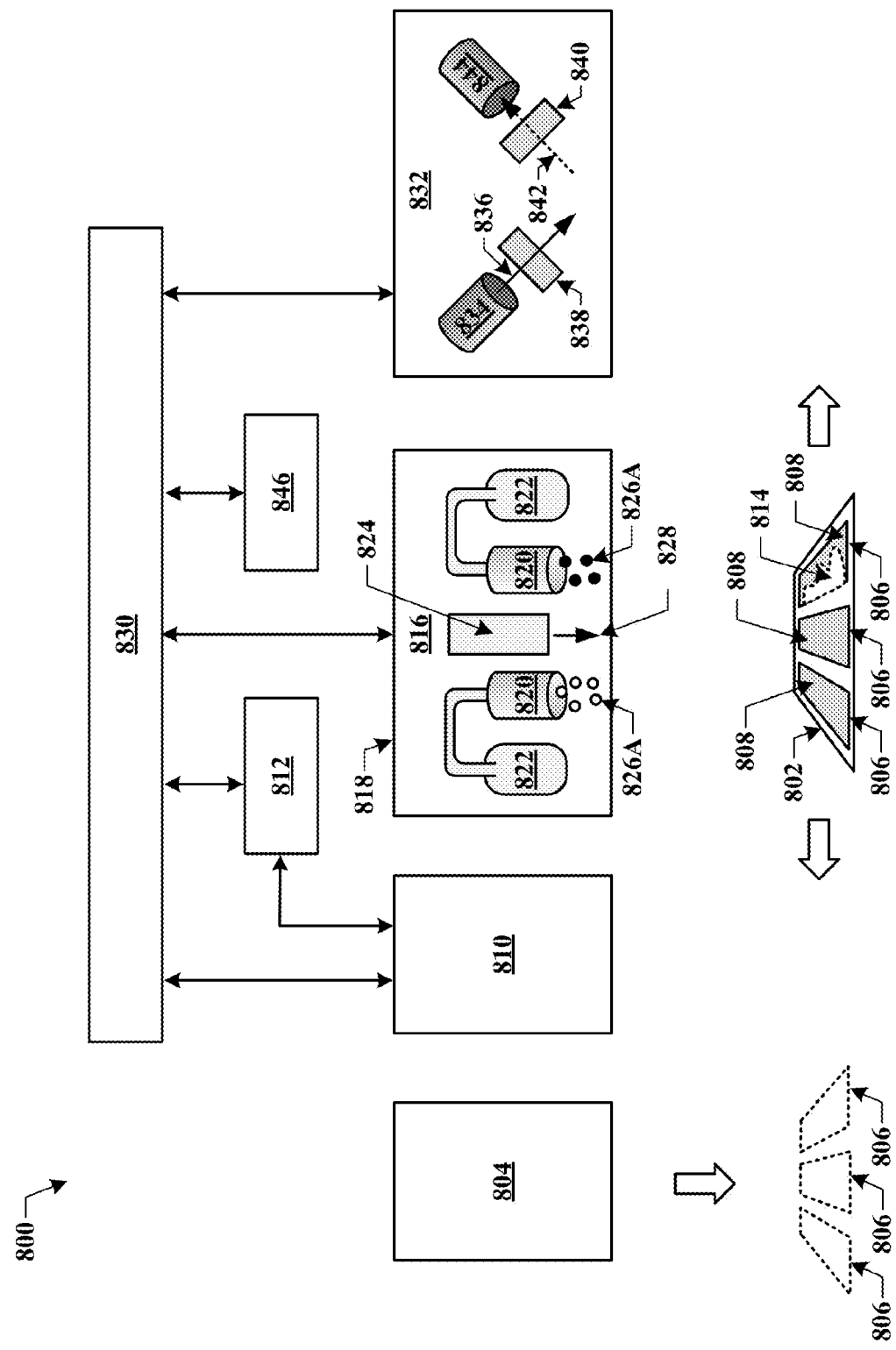
FIG. 8 illustrates some embodiments of a tool arrangement configured to repair a pattern formed on a transparent photomask.

FIG. 8 illustrates some embodiments of a tool arrangement 800 configured to repair a pattern formed on a transparent substrate 802 (e.g., quartz). The tool arrangement 800 comprises a mask writing tool 804 configured to define a target pattern 806. In some embodiments, the target pattern 806 comprises GDSII, GL1, or OASIS layout data, which is created in an industry-standard layout design tool (not shown). In some embodiments, the GDSII, GL1, or OASIS layout data is subjected to one or more mask preparation techniques, for lithography considerations, prior to delivery to the mask writing tool 804. The mask preparation techniques include optical proximity correction (OPC), assist feature (AF) insertion, etc.

In some embodiments, the mask writing tool 804 comprises an optical lithography tool configured to create an attenuating phase shift photomask (APSM) by patterning the transparent substrate 802 with a first translucent material 808 (e.g., molybdenum silicide (MoSi)). After patterning of the transparent substrate 802 by the mask writing tool 804 the transparent substrate 802 is inspected by a mask inspection tool 810. In some embodiments, the mask inspection tool 810 comprises an optical measurement tool such as a scanning electron microscopy (SEM) that scans the transparent substrate 802 to detect a missing portion 814 of the target pattern 806 on the transparent substrate 802. In some embodiments, the mask inspection tool 810 comprises an interferometer. In some embodiments, the target pattern 806 is stored in a memory 812, and the mask inspection tool 810 compares the target pattern 806 to the features defined by the first translucent material 808 to locate the missing portion 814 of the target pattern 806.

After locating the missing portion 814 of the target pattern 806 with the mask inspection tool 810, the missing portion 814 is repaired by a mask repair tool 816. In some embodiments, the mask repair tool 816 comprises an isolation chamber 818 (e.g., an ultra-high vacuum (UHV) chamber) configured to isolate the transparent substrate 802 from surrounding particles "in-situ." In some embodiments, the mask repair tool 816 comprises a focused electron beam induced deposition (FEBID) tool. The FEBID tool (816) further comprises a plurality of capillaries 820, wherein each capillary 820 is coupled to a gas supply 822 configured to supply each it with a precursor gas 826A, 826B. Note that while the mask repair tool 816 of FIG. 8 comprises two capillaries 820, other embodiments comprises three or more capillaries 820, each coupled its own gas supply 822.

The FEBID tool (816) also comprises an electron beam (e-beam) 824, configured to direct a focused beam of electrons 828 to the surface of the transparent substrate 802. In some embodiments, the e-beam 824 comprises a scanning or transmission electron microscope (SEM or TEM). The FEBID tool (816) is configured to expose the surface of the transparent substrate 802 to one or more of the precursor gas(es) 826A, 826B, which are absorbed by the surface. The absorbed precursor gas(es) 826A, 826B are then exposed to the focused e-beam 828 which dissociates the precursor gas(es) 826A, 826B into a second translucent material to form the missing portion 814 of the target pattern 806.

A controller 830 is couple to the mask repair tool 816 and configured to independently control the pressure and temperature within each gas supply 822. The controller 830 is also configured to independently control a flux of each precursor gas 826A, 826B through each capillary 820. By controlling the pressure, temperature, and flux of each gas, as well as the order of exposure, the controller 830 can control the composition and structure of the second translucent material formed from the precursor gas(es) 826A, 826B.

The tool arrangement 800 further comprises a mask measurement tool 832 configured to measure optical properties of the transparent substrate 802. In some embodiments, the mask measurement tool 832 comprises an ellipsometer configured to measure transmissive properties of the transparent substrate 802. The mask measurement tool 832 comprises a source 834 configured to provide electromagnetic radiation 836 (e.g., light), which is linearly polarized by a first polarizer 838. The mask measurement tool 832 also comprises a second polarizer 840, which linearly polarizes reflected radiation 842 (i.e., reflected by the surface of the transparent substrate 802) and received by a collector 844. By measuring the intensity of the polarized reflected radiation 842, the mask measurement tool 832 can determine various optical and structural parameters of the first (808) and second (not shown) translucent materials formed on the surface of the transparent substrate 802. These parameters include thickness, and optical properties such as index of refraction (n) and wavenumber (k) of the material.

The controller 830 is also configured to direct the mask repair tool 816 to form the second translucent material within the missing portion 814 of the target pattern 806, such that the target pattern 806 maintains its target width. The geometry of the repaired patter (814) is defined by the focused e-beam 828. The composition of the repaired patter (814) is controlled by the relative flux (e.g., partial pressures) of the precursor gas(es) 826A, 826B.

In some embodiments, to insure that the second translucent material that forms the repaired portion of pattern (814) exhibits the same transmissive properties as the first translucent material 808 (i.e., with respect to phase shifting of incident radiation), the second translucent material is formed from a single precursor gas (826A or 826B) with a thickness that is different than that of the first translucent material 808. The transmissive properties of the first and second transmissive material can be measured by the mask measurement tool 832. The transmissive properties comprise the index of refraction (n) and wavenumber (k) of the first and second translucent materials. The thickness of the second translucent material can also be monitored by the mask measurement tool 832.

By measuring values of n and k for the second translucent material as function of its thickness, the mask repair tool 816 can be calibrated to meet these values when forming the second translucent material. In some embodiments, the calibration includes setting values for exposure parameters to produce a repaired portion of pattern (814) comprising the second translucent material having a thickness such that it meets the desired values of n and k. In some embodiments, the exposure parameters comprise the temperature, pressure, flux, and/or duration of the precursor gas (826A or 826B) exposure, and/or energy focus and/or dose of the e-beam 828. In some embodiments, the exposure parameters, once calibrated, can be stored in a calibration tool 846 that is referenced by the controller 830.

In some embodiments, to insure that the second translucent material exhibits the same transmissive properties (i.e., values for n and k) as the first translucent material 808, the second translucent material is formed from a multiple precursor gas(es) (826A, 826B, etc.). By using multiple precursor gas(es) (826A, 826B, etc.), the width and thickness of the second translucent material can be made the same as first translucent material 808. The calibration tool 846 can again store exposure parameters measured by the mask measurement tool 832, and communicate them to the controller when repairing the target pattern 806 with multiple precursor gas(es) (826A, 826B, etc.).

In some embodiments, the calibration tool 846 is configured to repair the target pattern 806 by forming the second translucent material through a FEBID process. In some embodiments, the FEBID process comprises simultaneously exposing the surface of the transparent substrate 802 to the e-beam 828 and to the multiple precursor gas(es) (826A, 826B, etc.) to form a nearly homogenous compound of the second translucent material that forms the missing portion of the target pattern 806. In some embodiments, the FEBID process comprises sequentially exposing the surface of the transparent substrate 802 to the e-beam 828 and to the multiple precursor gas(es) (826A, 826B, etc.) to form a heterostructure that forms the missing portion of the target pattern 806.

In some embodiments, the values for n and k can of the second translucent material are "tuned" to meet those of the first translucent material 808. In such embodiments, the first and second translucent material also exhibit a same relative phase shift of the radiation that they transmit.

Therefore, some embodiments of the present disclosure relate to a method for repairing a photomask pattern, comprising receiving a photomask with a first translucent material formed on a transparent substrate, which forms an incomplete version of the photomask pattern. Missing portions of the photomask pattern are detected by comparing the incomplete version of the photomask pattern to a complete version of the photomask pattern. After detecting the missing portions, the photomask pattern is completed by using a second translucent material, which is different than the first translucent material, to form the missing portions. The second translucent exhibits the same transmissive property as the first translucent material. Consequently, both the repaired and unrepaired portions of the pattern have the same transmissive properties with respect to attenuation and phase shifting of incident radiation to enhance pattern resolution in the repaired portion of the photomask pattern.

In some embodiments, the present disclosure relates to a method, comprising receiving a photomask comprising a first translucent material formed on a transparent substrate, wherein the first translucent material forms an incomplete version of a photomask pattern, which is missing a portion of the photomask pattern. The method further comprises detecting the missing a portion of the photomask pattern by comparing the incomplete version of the photomask pattern to a complete version of the photomask pattern. After detecting the missing portion, completing the photomask pattern by using a second translucent material, which is different than the first translucent material, to form the missing portion of the photomask pattern.

In some embodiments, the present disclosure relates to a method of inspecting and repairing a photomask pattern formed on a transparent substrate. The method comprises receiving the photomask comprising a first translucent material formed on a transparent substrate, wherein the first translucent material is expected to form a complete version of the photomask pattern. The method further comprises comparing a pattern formed by the first translucent material to the complete version of the photomask pattern to determine whether a portion of the photomask pattern is missing. Based upon the determination of whether the portion of the photomask pattern is missing, the method further comprises selectively forming the missing portion by using a second translucent material, which is formed by combining third and fourth translucent materials, which are different from the first translucent material and from one-another, to form the missing portion of the pattern, thereby producing the pattern on the transparent photomask.

In some embodiments, the present disclosure relates to a transparent photomask, comprising a pattern formed on a surface of a transparent substrate, wherein the pattern comprises a first region of a first translucent material adjoining a second region of a second translucent material, the first translucent material differing from the second translucent material, wherein a refractive index of the first translucent material is equal to a refractive index of the second translucent material.

While methods 400, 500 and 600 have been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transparent photomask, comprising a pattern formed on a surface of a transparent substrate, wherein the pattern comprises a first region of a first translucent material adjoining a second region of a second translucent material, the first translucent material differing from the second translucent material, wherein a refractive index of the first translucent material is equal to a refractive index of the second translucent material.

2. The transparent photomask of claim 1, wherein the second translucent material is configured to transmit radiation that is 180° out of phase with radiation transmitted by the transparent substrate, and is in phase with radiation transmitted by the first translucent material.

3. The transparent photomask of claim 1, wherein the first translucent material comprises molybdenum silicide (MoSi).

4. The transparent photomask of claim 1, wherein the second translucent material includes a combination of a third translucent material and a fourth translucent material.

5. The transparent photomask of claim 4, wherein the third translucent material comprises chromium (Cr) and the fourth translucent material comprises silicon dioxide ($SiO_2$).

6. The transparent photomask of claim 4, wherein the third and fourth translucent materials form a heterostructure comprising a layer of the third translucent material disposed beneath a layer of the fourth translucent material.

7. The transparent photomask of claim 4, wherein the second translucent material includes a combination of a third material and a fourth translucent material, which both laterally contact the first translucent material.

8. The transparent photomask of claim 1, wherein the first region includes a first linear segment that adjoins a second linear segment of the second region, and wherein the first and second linear segments are co-linear and have equal widths.

9. A photomask, comprising:
a substrate that is transmissive to electromagnetic radiation;
a first patterned structure arranged contacting an upper surface of the substrate and comprising a first material that is configured to reduce transmission of electromagnetic radiation through the substrate; and
a second patterned structure arranged contacting the upper surface of the substrate at a location laterally offset from the first patterned structure and comprising a second material and a third material that is different than the first material and second material, wherein the second material and the third material are collectively configured to reduce transmission of electromagnetic radiation through the substrate.

10. The photomask of claim 9, wherein the second patterned structure comprises a layer of the second material stacked onto a layer of the first material.

11. The photomask of claim 9, wherein the first material and the second material are inter-mixed throughout the second patterned structure.

12. The photomask of claim 9, wherein a sidewall of the first material of the first patterned structure laterally contacts a sidewall of the second material and the third material of the second patterned structure.

13. The photomask of claim 9, wherein the first material is different than both the second material and the third material.

14. The photomask of claim 9,
wherein the second material comprises silicon dioxide and the third material comprises chromium; and
wherein the first material comprises molybdenum silicon.

15. The photomask of claim 9, wherein a sidewall of the first patterned structure is separated from a sidewall of the second patterned structure.

16. The photomask of claim 15, wherein the upper surface of the substrate is recessed between the first patterned structure and the second patterned structure.

17. A photomask, comprising:
a quartz substrate;

a first patterned structure arranged along an upper surface of the quartz substrate and comprising a molybdenum silicon alloy;

a second patterned structure arranged along the upper surface of the quartz substrate and comprising chromium and silicon dioxide; and wherein the molybdenum silicon alloy of the first patterned structure laterally contacts the chromium and the silicon dioxide of the second patterned structure.

18. The photomask of claim 17, wherein the upper surface of the quartz substrate is recessed between the first patterned structure and the second patterned structure.

19. The photomask of claim 17, wherein the first patterned structure is comprised of a first material and the second patterned structure is comprised a second material, and wherein the first material has a first refractive index equal to a second refractive index of the second material.

20. The photomask of claim 17, wherein the second patterned structure comprises a mixture of chromium and the silicon dioxide that extends along a height of the second patterned structure.

21. The photomask of claim 17, wherein the chromium and the silicon dioxide have a same footprint viewed from over the quartz substrate.

* * * * *